United States Patent
Bae et al.

(10) Patent No.: US 10,930,610 B2
(45) Date of Patent: Feb. 23, 2021

(54) SEMICONDUCTOR CHIP INCLUDING A BUMP STRUCTURE AND SEMICONDUCTOR PACKAGE INCLUDING THE SAME

(71) Applicant: SAMSUNG ELECTRONICS CO., LTD., Suwon-si (KR)

(72) Inventors: Jin-Kuk Bae, Hwaseong-si (KR); Hyun-Soo Chung, Hwaseong-si (KR); Han-Sung Ryu, Seoul (KR); In-Young Lee, Yongin-si (KR); Chan-Ho Lee, Hwaseong-si (KR)

(73) Assignee: SAMSUNG ELECTRONICS CO., LTD, Suwon-si (KR)

( * ) Notice: Subject to any disclaimer, the term of this patent is extended or adjusted under 35 U.S.C. 154(b) by 0 days.

(21) Appl. No.: 16/283,906

(22) Filed: Feb. 25, 2019

(65) Prior Publication Data
US 2020/0013740 A1    Jan. 9, 2020

(30) Foreign Application Priority Data
Jul. 3, 2018 (KR) .......................... 10-2018-0077321

(51) Int. Cl.
*H01L 23/00* (2006.01)
*H01L 23/48* (2006.01)

(52) U.S. Cl.
CPC .............. *H01L 24/13* (2013.01); *H01L 24/08* (2013.01); *H01L 2924/1434* (2013.01)

(58) Field of Classification Search
CPC ......... H01L 24/05; H01L 24/08; H01L 24/13; H01L 24/03; H01L 24/11; H01L 2224/0401
See application file for complete search history.

(56) References Cited

U.S. PATENT DOCUMENTS

| | | | |
|---|---|---|---|
| 6,940,178 B2 | 9/2005 | Kweon et al. | |
| 7,659,192 B2 | 2/2010 | Yeohi et al. | |
| 8,039,958 B2 | 10/2011 | Platz et al. | |
| 8,293,587 B2 | 10/2012 | Jadhav et al. | |
| 8,957,524 B2 | 2/2015 | Breuer et al. | |
| 9,136,234 B2* | 9/2015 | Lehr | H01L 24/11 |
| 9,425,136 B2 | 8/2016 | Kuo et al. | |
| 2012/0049356 A1* | 3/2012 | Migita | H01L 24/13 257/737 |
| 2012/0119364 A1* | 5/2012 | Vaghela | H01L 24/11 257/750 |
| 2016/0148888 A1 | 5/2016 | Ryu et al. | |

(Continued)

*Primary Examiner* — David C Spalla
(74) *Attorney, Agent, or Firm* — F. Chau Associates, LLC

(57) ABSTRACT

A semiconductor chip includes a substrate having a low-k material layer. An electrode pad is disposed the substrate. A first protection layer at least partially surrounds the electrode pad. The first protection layer includes a first opening at an upper portion thereof. A buffer pad is electrically connected to the electrode pad. A second protection layer at least partially surrounds the buffer pad. The second protection layer includes a second opening at an upper portion thereof. A pillar layer and a solder layer are sequentially stacked on the buffer pad. A thickness of the buffer pad is greater than a thickness of the electrode pad. A width of the first opening in a first direction parallel to an upper surface of the semiconductor substrate is equal to or greater than a width of the second opening in the first direction.

20 Claims, 14 Drawing Sheets

(56) References Cited

U.S. PATENT DOCUMENTS

| | | |
|---|---|---|
| 2016/0148891 A1 | 5/2016 | Tsao et al. |
| 2017/0084561 A1* | 3/2017 | Seo .................. H01L 24/05 |
| 2017/0365571 A1* | 12/2017 | Matsuda .......... H01L 23/49866 |
| 2018/0053740 A1 | 2/2018 | Kakade et al. |
| 2018/0061796 A1 | 3/2018 | Aoki et al. |
| 2019/0237430 A1* | 8/2019 | England .............. H01L 24/03 |

* cited by examiner

US 10,930,610 B2

SEMICONDUCTOR CHIP INCLUDING A BUMP STRUCTURE AND SEMICONDUCTOR PACKAGE INCLUDING THE SAME

CROSS-REFERENCE TO RELATED APPLICATION

This application claims priority to Korean Patent Application No. 10-2018-0077321, filed on Jul. 3, 2018, in the Korean Intellectual Property Office, the disclosure of which is incorporated by reference herein in its entirety.

TECHNICAL FIELD

The present disclosure relates to a semiconductor chip and, more particularly, to a semiconductor chip including a bump structure and a semiconductor package including the semiconductor chip.

DISCUSSION OF THE RELATED ART

Electronic devices have become smaller and are able to perform more functions. As a result, semiconductor chips used in electronic devices have become more highly integrated. Such semiconductor chips may have small connection terminals with a fine pitch. To package such high-capacity semiconductor chips, a bump structure may be used. The size of the bump structure included in the semiconductor package has also steadily decreased to accommodate the more highly integrated semiconductor chips.

SUMMARY

A semiconductor chip includes a substrate having a low-k material layer. An electrode pad is disposed on the substrate. A first protection layer at least partially surrounds the electrode pad. The first protection layer includes a first opening at an upper portion thereof. A buffer pad is electrically connected to the electrode pad. A second protection layer at least partially surrounds the buffer pad. The second protection layer includes a second opening at an upper portion thereof. A pillar layer and a solder layer are sequentially stacked on the buffer pad. A thickness of the buffer pad is greater than a thickness of the electrode pad. A width of the first opening in a first direction parallel to an upper surface of the semiconductor substrate is equal to or greater than a width of the second opening in the first direction.

A semiconductor chip includes a semiconductor substrate having an interlayer dielectric comprising a low-k material and an electrode pad arranged on the interlayer dielectric. A protection layer at least partially covers a side surface and an upper surface of the electrode pad. The protection layer includes an inner space having a first opening at a lower portion of the inner space and a second opening at an upper portion of the inner space. A buffer pad is disposed in the inner space of the protection layer and is electrically connected to the electrode pad via the first opening. A bump structure, which is not in the inner space of the protection layer, is formed above the protection layer, and is electrically connected to the buffer pad via the second opening. A width of the first opening in a first direction parallel to an upper surface of the semiconductor substrate is equal to or greater than a width of the second opening in the first direction.

A semiconductor package includes a package substrate having a substrate pad and a semiconductor chip mounted above the package substrate. The semiconductor chip includes an electrode pad disposed on a semiconductor substrate and having a low-k material layer. A first protection layer includes a first opening at an upper portion of the first protection layer and at least partially surrounding the electrode pad. A buffer pad is electrically connected to the electrode pad. A second protection layer includes a second opening at an upper portion of the second protection layer and at least partially surrounding the buffer pad. A pillar layer and a solder layer are sequentially stacked on the buffer pad. A thickness of the buffer pad is greater than a thickness of the electrode pad. A width of the first opening in the first direction parallel to an upper surface of the semiconductor substrate is equal to or greater than a width of the second opening in the first direction. The solder layer is electrically connected to the substrate pad.

BRIEF DESCRIPTION OF THE DRAWINGS

Embodiments of the inventive concept will be more clearly understood from the following detailed description taken in conjunction with the accompanying drawings, in which.

DETAILED DESCRIPTION OF THE EMBODIMENTS

Hereinafter, exemplary embodiments of the present inventive concept will be described in detail will reference to the accompanying drawings.

Figure 1:
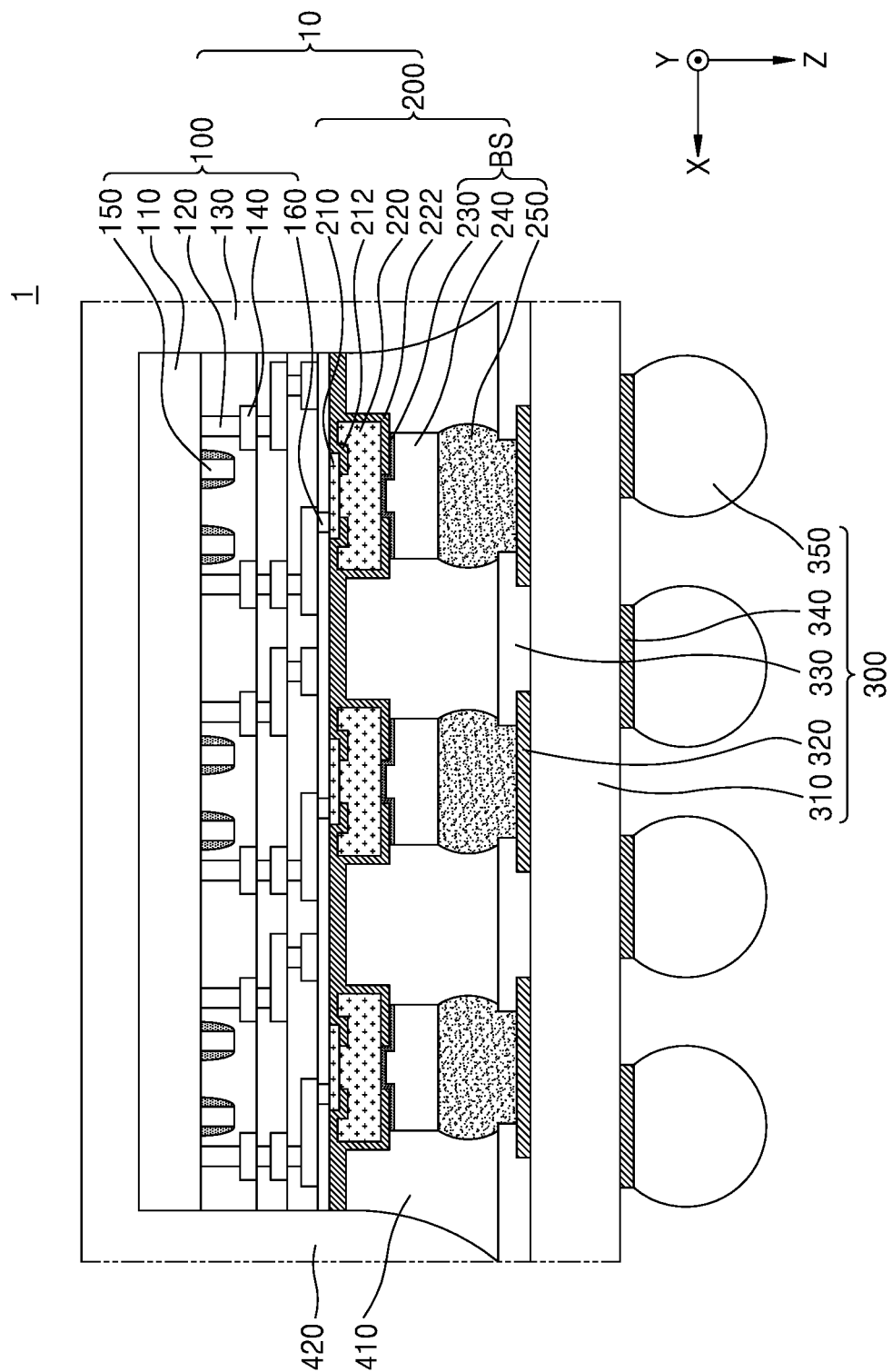
FIG. 1 is a cross-sectional view illustrating a semiconductor package according to an exemplary embodiment of the present inventive concept.

FIG. 1 is a cross-sectional view of a semiconductor package 1 according to an exemplary embodiment of the present inventive concept.

Referring to FIG. 1, the semiconductor package 1 may include a semiconductor device 100, a package substrate 300, and a connection structure 200 connecting the semiconductor device 100 to the package substrate 300. The semiconductor package 1 may be a flip chip package in which the semiconductor device 100 is mounted, by the connection structure 200, above the package substrate 300 in a face-down manner.

The semiconductor device 100 and the connection structure 200 may together be thought of as a semiconductor chip. In particular, the semiconductor chip 10 may include an electrode pad 210 formed on a semiconductor substrate 110. The electrode pad 210 may be configured to externally expand circuit functions included in the semiconductor device 100. A circuit portion including an individual unit element 150 for performing circuit functions of the semiconductor device 100 may be formed in the semiconductor chip 10 via a semiconductor fabricating process. For example, the semiconductor device 100 including the semiconductor chip 10 may include a transistor, a resistor, a capacitor, a conductive wiring, and/or an insulating layer arranged therebetween.

The electrode pad 210 may be partially exposed by a first protection layer 212 formed on the circuit portion of the semiconductor device 100. The electrode pad 210 may be electrically connected to the circuit portion of the semiconductor device 100 through an upper via 160, and thus the circuit portion of the semiconductor device 100 may be electrically connected to the package substrate 300.

According to some exemplary embodiments of the present inventive concept, the semiconductor chip 10 may include a logic chip and/of a memory chip. The logic chip may include, for example, a microprocessor, an analog device, and/or a digital signal processor. In addition, the memory chip may include, for example, a volatile memory chip such as dynamic random access memory (DRAM) or static RAM (SRAM), or a nonvolatile memory chip such as phase-change RAM (PRAM), ferroelectric RAM (FeRAM), or resistive RAM (RRAM). According to some exemplary embodiments of the present inventive concept, the semiconductor chip 10 may include high bandwidth memory device. According to some exemplary embodiments of the present inventive concept, the semiconductor chip 10 may include an interposer and/or a controller.

The semiconductor chip 10 may include a high bandwidth memory device which does not include a redistribution layer. The high bandwidth memory device may require a larger portion of the connection structure for signal transmission, as compared to other memory devices. And thus, a formation of the redistribution layer may be accompanied by difficulties in circuit design and semiconductor fabricating processes.

The package substrate 300 may include a base 310, an inner connection pad 320, an insulating layer 330, an outer connection pad 340, and an external terminal 350.

The base 310 may include a phenolic resin, an epoxy resin, and/or a polyimide. The inner connection pad 320 may be formed above one side of the base 310 and may electrically connect the package substrate 300 to the connection structure 200. The insulating layer 330 may be formed above an upper surface of the base 310 and may expose a portion of an upper surface of the inner connection pad 320. The outer connection pad 340 may be formed on the other side of the base 310, and the external terminal 350 may be attached on the outer connection pad 340. For example, the external terminal 350 may include a solder ball or a solder bump. The external terminal 350 may electrically connect the semiconductor package 1 to an external electrical device.

According to some exemplary embodiments of the present disclosure, when the package substrate 300 is a printed circuit board (PCB), the base 310 may be formed in a film state by compressing a polymer material such as a thermosetting resin, an epoxy resin or a phenolic resin such as a flame retardant 4 (FR-4), a bismaleimide triazine (BT), and/or a ajinomoto build-up film (ABF), to a certain thickness. After applying copper foil to both sides of the base 310, the base 310 may be implemented by forming a wiring pattern, which is a transmission path of an electrical signal. In addition, the inner connection pad 320 and the outer connection pad 340 may be electrically connected to each other through a via passing through the base 310. Except for the inner connection pad 320 and the outer connection pad 340, a solder resist may be entirely coated on a lower surface and an upper surface of the base 310 to form a lower protection layer and an upper protection layer.

According to some exemplary embodiments of the present disclosure, the PCB may be divided into a single layer PCB with wiring only on a single side of the PCB and a double layer PCB with wiring on both sides of the PCB. Further, the number of layers of copper foil that may be formed may be three or more by using an insulator called a prepreg. PCB of multilayer wiring may be formed by forming three or more wiring layers according to the number of formed layers of copper foil. The package substrate 300 of the semiconductor package 1, according to exemplary embodiments of the present inventive concept, is not limited to a structure or a material of the PCB.

A bump structure BS of the semiconductor chip 10 may be attached to the inner connection pad 320 of the package substrate 300, and thus the electrode pad 210 of the semiconductor chip 10 may be electrically connected to the inner connection pad 320. The bump structure BS may include a seed layer 230, a pillar layer 240, and a solder layer 250.

An underfill 410 may be formed in a space between the semiconductor chip 10 and the package substrate 300. The underfill 410 may surround sidewalls of the connection structure 200 to fill spaces between adjacent connection structures 200.

A molding member 420 may protect the semiconductor chip 10 from external influences such as an impact. For performing such a role, the molding member 420 may include an epoxy mold compound or a resin, or the like. In addition, the molding member 420 may be formed by a process such as a compression molding, a lamination, or a screen printing, or the like. According to some exemplary embodiments of the present inventive concept, the molding member 420 may cover a side surface of the semiconductor chip 10 such that the upper surface of the semiconductor chip 10 may be left exposed.

Figure 2:
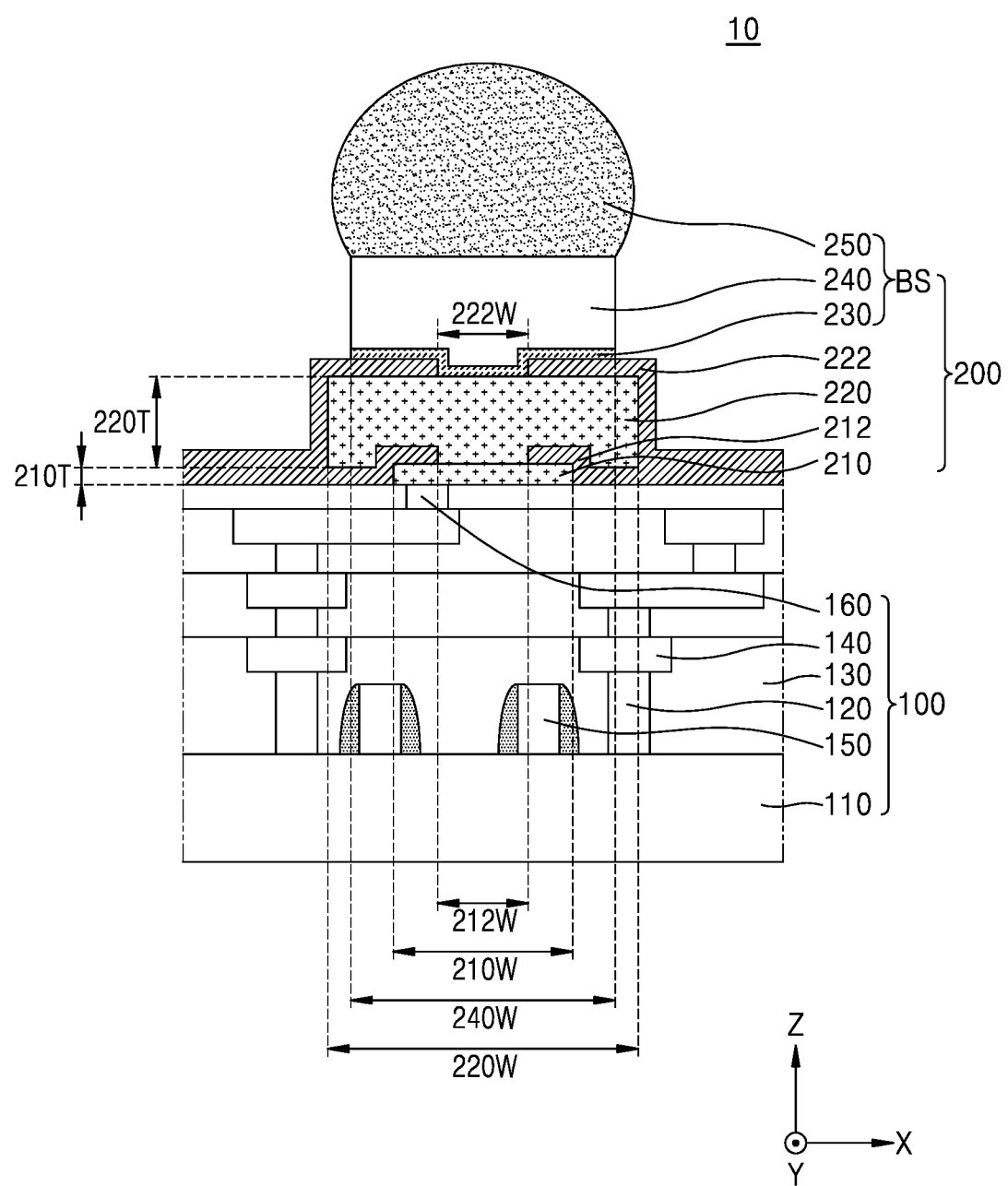
FIG. 2 is a cross-sectional view of a semiconductor chip according to an exemplary embodiment of the present inventive concept.

FIG. 2 is a cross-sectional view of the semiconductor chip 10 according to an exemplary embodiment of the present inventive concept.

Referring to FIG. 2, the semiconductor chip 10, in which the connection structure 200 is arranged above the upper surface of the semiconductor device 100, is shown.

The semiconductor device 100 and the connection structure 200 may together make up the semiconductor chip 10. For convenience of explanation, it is defined that a first direction X and a second direction Y are parallel to a plane of an upper surface of the semiconductor substrate 110, and a third direction Z is perpendicular to the upper surface of the semiconductor substrate 110.

The semiconductor chip 10 may include the electrode pad 210 arranged above the semiconductor device 100, a first protection layer 212 at least partially surrounding the electrode pad 210, a buffer pad 220 electrically connected to the electrode pad 210, a second protection layer 222 at least partially surrounding the buffer pad 220, and the bump structure BS arranged above the buffer pad 220.

A thickness 220T of the buffer pad 220 in the third direction Z may be greater than a thickness 210T of the electrode pad 210 in the third direction Z. According to some exemplary embodiments of the present inventive concept, the thickness 220T of the buffer pad 220 may be about 5 times to about 10 times greater than the thickness 210T of the electrode pad 210.

A width 220W of the buffer pad 220 in the first direction X may be greater than a width 210W of the electrode pad 210 in the first direction. According to some exemplary embodiments of the present inventive concept, the width 220W of the buffer pad 220 may be about 1.5 times to about 3 times greater than the width 210W of the electrode pad 210.

A width 240W of the pillar layer 240 in the first direction X may be greater than the width 210W of the electrode pad 210 in the first direction X and may be less than the width 220W of the buffer pad 220 in the first direction X.

Accordingly, the buffer pad 220 may relieve stress applied to the electrode pad 210 and the semiconductor device 100 as the buffer pad 220 is thicker and bigger than the electrode pad 210.

A width 222W of a second opening of the second protection layer 222 in the first direction X may be substantially same as a width 212W of a first opening of the first protection layer 212 in the first direction X. According to an exemplary embodiment of the present inventive concept, the width 222W of the second opening may be less than the width 212W of the first opening.

The buffer pad 220 may be strengthened and damage to the upper surface of the buffer pad 220 that is due to a fluorine (F) gas generated in a process of forming the second opening of the second protection layer 222 when an exposed central portion of the buffer pad 220 may be minimized.

In a semiconductor device, an interlayer dielectric may include a low dielectric material. The low dielectric material is a material having a lower dielectric constant than silicon oxide. When the interlayer dielectric is used in a semiconductor device, high integration and high speed of a semiconductor device with an increased insulating ability may be provided.

However, elastic modulus and hardness of the low dielectric material are relatively low due to a porous film quality of the low dielectric material as compared with other dielectric materials, and thus, the low dielectric material may be vulnerable to stress.

Due to such properties, a use of the low dielectric material in a semiconductor package including a bump structure may be limited. Particularly, a high elastic modulus of a material including the bump structure may diffuse stress to the interlayer dielectric located below the bump structure, and thus defects such as cracking and/or peeling of the interlayer dielectric may be caused.

In fabricating some semiconductor chips, a redistribution layer may be formed above the semiconductor device to separate the bump structure from the interlayer dielectric is being used. However, a high bandwidth memory device may encounter more of the connection structures for signal transmission, as compared to other memory devices. And thus, the formation of the redistribution layer may be accompanied by difficulties in circuit design and semiconductor fabricating processes.

Therefore, the semiconductor chip 10, according to exemplary embodiments of the inventive concept, may form the buffer pad 220 under the bump structure BS and relieve stress generated in the bump structure BS, and thus, defects such as cracking and/or peeling of an interlayer dielectric 130 including a low dielectric material may be reduced.

Ultimately, the electrical characteristics and reliability of the semiconductor chip 10 and the semiconductor package 1 (see FIG. 1) including the semiconductor chip 10 may be increased.

FIGS. 3 through 11 are cross-sectional views illustrating a method of fabricating the semiconductor chip 10, according to an exemplary embodiment of the present inventive concept.

Figure 3:
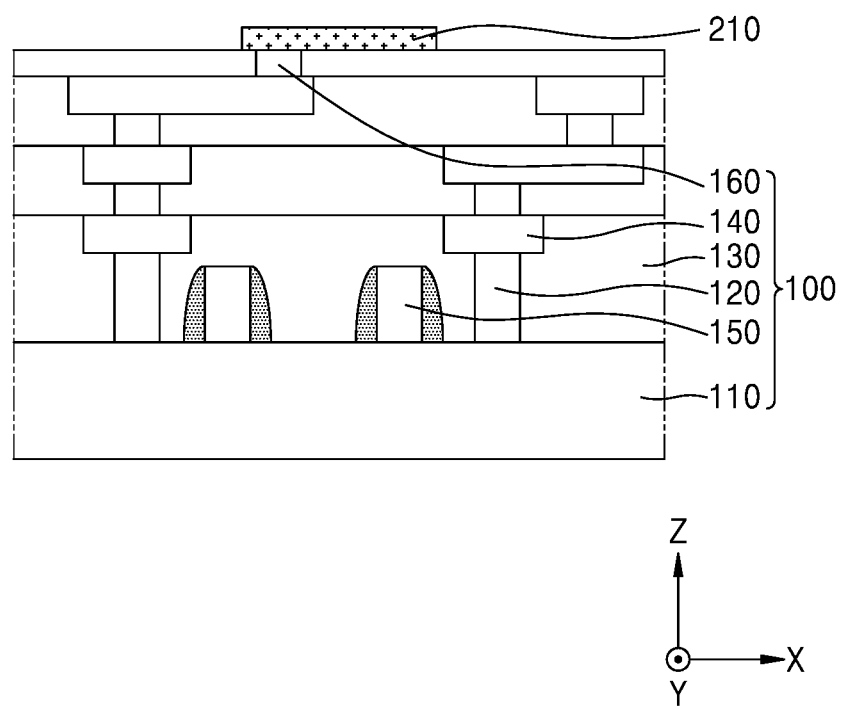
FIGS. 3 through 11 are cross-sectional views illustrating a method of fabricating a semiconductor chip, according to an exemplary embodiment of the present inventive concept.

Referring to FIG. 3, the semiconductor device 100 includes the electrode pad 210 that is configured to extend an integrated circuit functional structure of the individual unit element 150 above the semiconductor substrate 110.

The semiconductor substrate 110 may include a semiconductor wafer substrate on which a plurality of semiconductor devices 100 arranged in a matrix form are separated from each other by a scribe lane.

The semiconductor substrate 110 may include, for example, silicon. Alternatively, the semiconductor substrate 110 may include a semiconductor element such as germanium, or a compound semiconductor such as silicon carbide (SiC), gallium arsenide (GaAs), indium arsenide (InAs), and/or indium phosphide (InP). Alternatively, the semiconductor substrate 110 may have a silicon on insulator (SOI) structure. For example, the semiconductor substrate 110 may include a buried oxide layer (BOX). The semiconductor substrate 110 may include a conductive region, for example, a well doped with an impurity or a structure doped with an impurity. In addition, the semiconductor substrate 110 may have various device isolation structures such as a shallow trench isolation (STI) structure.

A circuit portion including the individual unit element 150 for implementing the integrated circuit function of the semiconductor device 100 through a semiconductor fabricating process, may be formed on the semiconductor substrate 110. For example, the individual unit element 150, such as a transistor, a resistor, and a capacitor, a conductive via 120, a conductive wiring 140, a wiring layer such as the upper via 160, and the interlayer dielectric 130 arranged therebetween may be formed on the semiconductor substrate 110.

According to some exemplary embodiments of the present inventive concept, the interlayer dielectric 130 may include a low-k material layer having a lower dielectric permittivity than silicon oxide. For example, the dielectric material of the interlayer dielectric 130 may be phosphor silicate glass (PSG), undoped silicate glass (USG), tetra ethyl ortho silicate (TEOS), plasma enhanced-TEOS (PE-TEOS), high density plasma-chemical vapor deposition (HDP-CVD) oxide, a dielectric material used in BEOL, an ultra-low dielectric material, or the like.

According to some exemplary embodiments of the present inventive concept, the interlayer dielectric 130 may have a structure in which a first interlayer dielectric, a second interlayer dielectric, a third interlayer dielectric, and a fourth interlayer dielectric are sequentially stacked. However, in the present invention, the number of interlayer dielectrics of the interlayer dielectric 130 is not limited thereto.

The interlayer dielectric 130 may be arranged to at least partially fill a periphery of the wiring layer such as the conductive via 120 and the conductive wiring 140 including a conductive material. In addition, the interlayer dielectric 130 may be arranged to at least partially fill a periphery of the upper via 160 electrically connected and in direct contact to the electrode pad 210.

The electrode pad 210 may be electrically connected to the circuit portion of the semiconductor device 100 to perform a function of electrically connecting the semiconductor device 100 to an external electrical device. The electrode pad 210 may be electrically connected to the conductive via 120 of a lower portion of the semiconductor device 100 and the conductive wiring 140, through the upper via 160 of the semiconductor device 100.

Multiple electrode pads 210 may be formed above the semiconductor device 100 as a portion for inputting/outputting an electrical signal to/from the semiconductor device 100 and may include aluminum (Al), tungsten (W), copper (Cu), nickel (Ni), or combinations thereof. The electrode pad 218 may form a metal, such as aluminum (Al), to a predetermined thickness above the semiconductor device 100, and then a desired shape of an electrode pad 210 may be fabricated by patterning by performing a photolithography process and an etching process.

Figure 4:
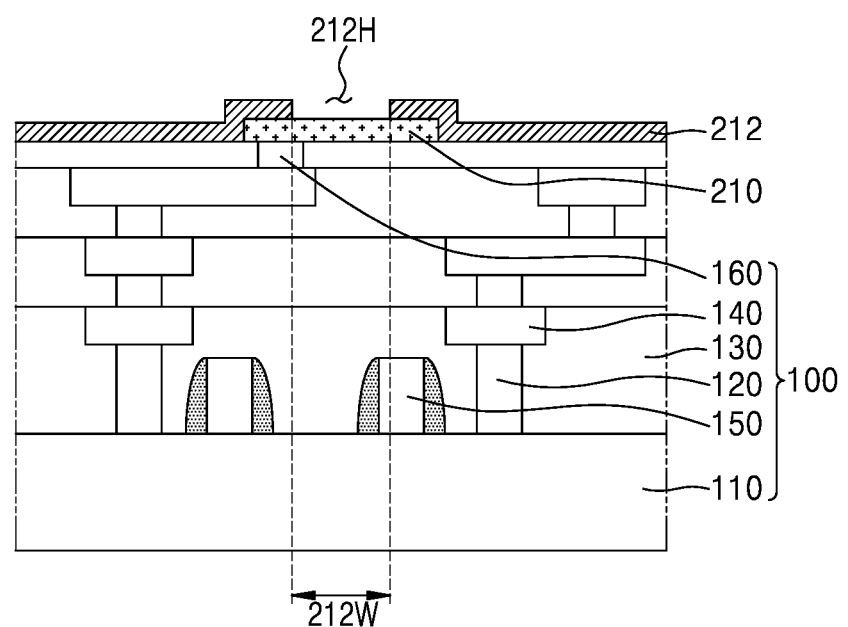
Figure 4:
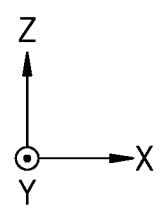

Referring to FIG. 4, the first protection layer 212 having a first opening 212H may be formed above each of the electrode pad 210 and the semiconductor device 100.

After forming a protection layer above both the electrode pad 210 and the semiconductor device 100, the protection layer is patterned by a photolithography process and an etching process to form the first protection layer 212 including the first opening 212H which exposes the center of the electrode pad 210.

The first protection layer 212 may include the first opening 212H which exposes the center of the electrode pad 210. For example, the electrode pad 210 may be partially exposed by the first protection layer 212, which is a final protection layer of the circuit portion of the semiconductor device 100. The electrode pad 210 may be electrically connected to the circuit portion of the semiconductor device 100 through the upper via 160 and may be electrically connected to an external electrical device through a portion of the electrode pad 210 exposed by the first opening 212H. The width 212W of the first opening 212H of the first protection layer 212 in the first direction X may be substantially equal to a degree of exposure of a general electrode pad.

The first protection layer 212 may be arranged on a remaining portion, in the upper portion of the semiconductor device 100, except for a region where the electrode pad 210 is formed, and the semiconductor device 100 may be insulated in a region other than the electrode pad 210. In addition, the first protection layer 212 may protect the upper surface of the semiconductor device 100 from contamination by external impurities, and physical impact or the like. According to some exemplary embodiments of the present inventive concept, the first protection layer 212 may include a plurality of material layers.

A material of the first protection layer 212 may include, for example, silicon oxide, silicon nitride, polyimide, benzocyclobutene, polybenzoxazole, bismaleimide triazine (BT), a phenolic resin, an epoxy, and/or an equivalent thereof.

Figure 5:
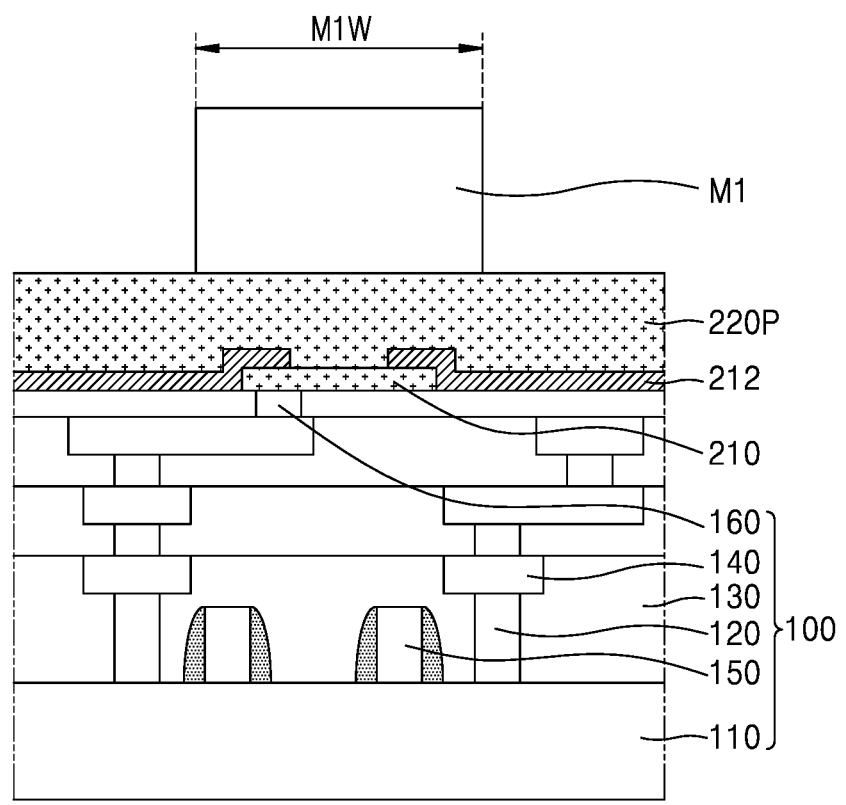

Referring to FIG. 5, a reserve buffer pad 220P is formed at least partially surrounding each of the electrode pad 210 and the first protection layer 212 and the reserve buffer pad 220P is electrically connected to the electrode pad 210 through the first opening 212H (see FIG. 4). In addition, a first mask pattern M1 is formed above the reserve buffer pad 220P.

After forming the reserve buffer pad 220P above the electrode pad 210 and the first protection layer 212 to a predetermined thickness by a chemical vapor deposition process or a physical vapor deposition process, the first mask pattern M1 is formed above the reserve buffer pad 220P through a photolithography process and a development process.

The reserve buffer pad 220P may include Al, Cu, Ni, or combinations thereof. According to some exemplary embodiments of the present inventive concept, the reserve buffer pad 220P may include a same material as the electrode pad 210.

The first mask pattern M1 may cover all of the electrode pad 210 in the first direction X and may form a width M1W covering a portion of the first protection layer 212. A process of forming the first mask pattern M1 includes depositing a photoresist material above the reserve buffer pad 220P and patterning the photoresist material by exposure. The patterned photoresist forms a first mask pattern M1. A region where the buffer pad 220 (see FIG. 6), to be described later, is formed may be defined by the first mask pattern M1.

Figure 6:
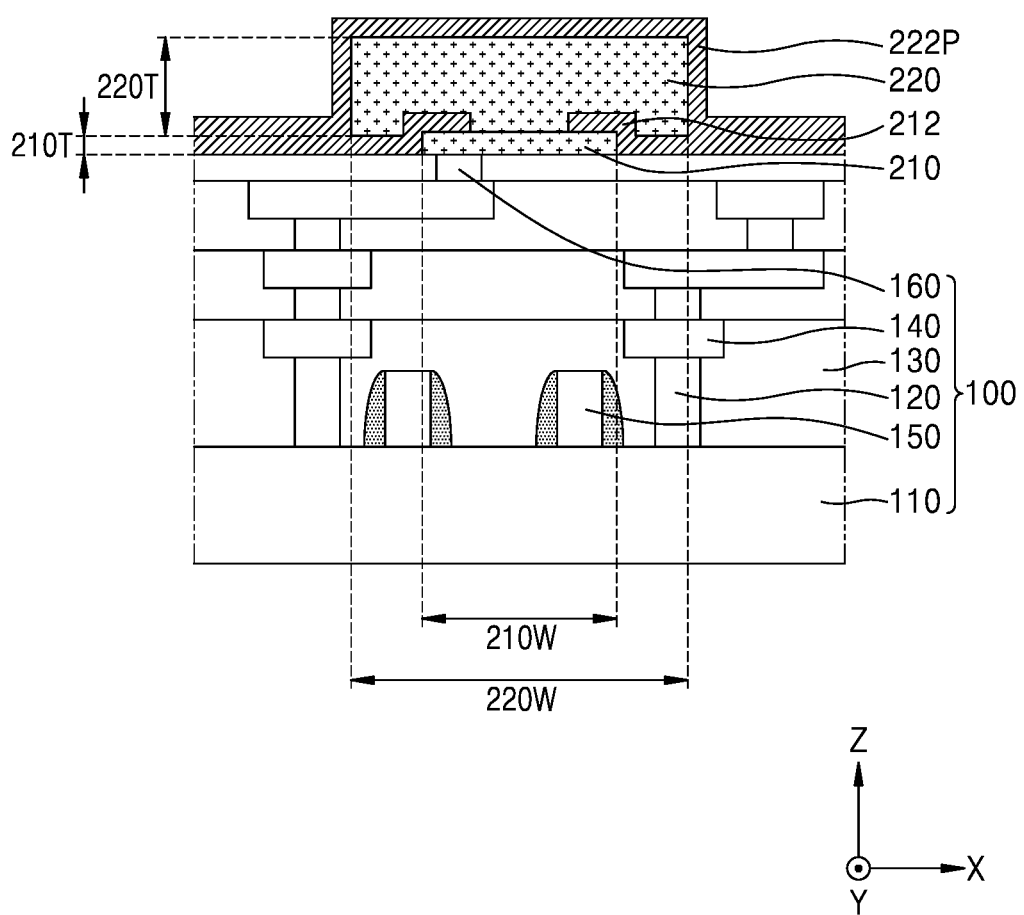

Referring to FIG. 6, after forming a buffer pad 220 by etching the reserve buffer pad 220P (see FIG. 5) by using the first mask pattern M1 (see FIG. 5) as an etching mask, the first mask pattern M1 (see FIG. 5) is removed. In addition, a second pre-protection layer 222P is formed above the buffer pad 220 and the first protection layer 212. The second pre-protection layer 222P may be formed to completely cover the buffer pad 220.

A strip process and/or an ashing process may be performed to remove the first mask pattern M1 (see FIG. 5). Thereafter, the second pre protection layer 222P is formed above the buffer pad 220 and the first protection layer 212.

The buffer pad 220 may be formed above the first protection layer 212 and may be directly in contact and electrically connected to the electrode pad 210 through the first opening 212H (see FIG. 4). The buffer pad 220 may include Al, W, Cu, Ni, or combinations thereof. According to some exemplary embodiments of the present inventive concept, the buffer pad 220 may include a same material as the electrode pad 210.

The thickness 220T of the buffer pad 220 in the third direction Z may be greater than the thickness 210T of the electrode pad 210 in the third direction Z. According to some exemplary embodiments of the present inventive concept, the thickness 220T of the buffer pad 220 may be about 5 times to about 10 times greater than the thickness 210T of the electrode pad 210.

The width 220W of the buffer pad 220 in the first direction X may be greater than the width 210W of the electrode pad 210 in the first direction. According to some exemplary embodiments of the present inventive concept, the width 220W of the buffer pad 220 may be about 1.5 times to about 3 times greater than the width 210W of the electrode pad 210.

Therefore, the buffer pad 220 may relieve stress applied to the electrode pad 210 and the semiconductor device 100 as the buffer pad 220 is thicker and greater than the electrode pad 210. Details of this will be described later with reference to FIG. 13.

The second pre-protection layer 222P may be formed in a remaining portion except for a region where the buffer pad 220 is formed, and thus the semiconductor device 100 may be insulated in a region other than the buffer pad 220. In addition, the second pre-protection layer 222P may protect the buffer pad 220 from external impurities, and physical impact, or the like. According to some exemplary embodiments of the present inventive concept, the second pre-protection layer 222P may include a plurality of material layers.

A material of the second pre-protection layer 222P may include, for example, silicon oxide, silicon nitride, polyimide, benzocyclobutene, polybenzoxazole, bismaleimide triazine (BT), a phenolic resin, an epoxy, and/or an equivalent thereof. For example, the second pre-protection layer 222P may include a same material as the first protection layer 212. The buffer pad 220 may be arranged in an internal space defined by a protection layer including the second pre-protection layer 222P and the first protection layer 212.

Figure 7:
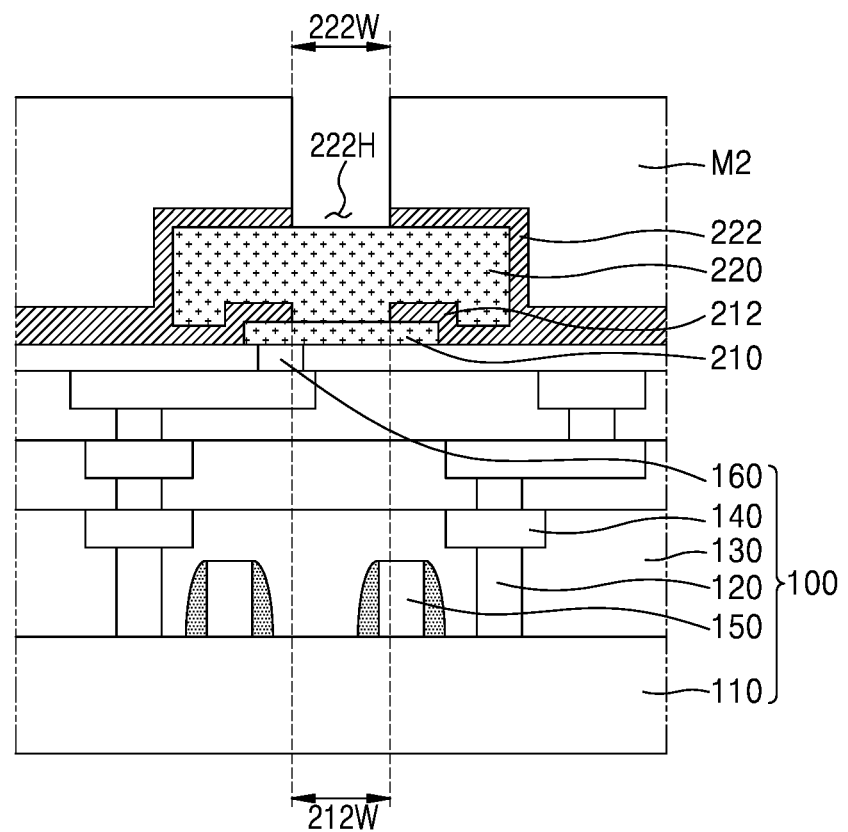

Referring to FIG. 7, a second mask pattern M2 is formed above the second pre-protection layer 222P (see FIG. 6), and the second protection layer 222 is formed by etching the second pre-protection layer 222P (see FIG. 6) by using the second mask pattern M2 as an etching mask.

The second mask pattern M2 is formed above the second pre-protection layer 222P (see FIG. 6) by a photolithography process and a development process. The second mask pattern M2 may be formed in a pattern exposing a portion of the second pre-protection layer 222P (see FIG. 6). The exposed portion of the second pre-protection layer 222P (see FIG. 6) may be removed to expose a central portion of the upper surface of the buffer pad 220.

The exposed central portion of the buffer pad 220 by the second mask pattern M2 corresponds to a portion directly contacting to a pre-seed layer 230P (see FIG. 8) in a subsequent process. A second opening 222H of the second protection layer 222 in the first direction X may be formed such that the exposed central portion of the buffer pad 220 may be minimized. In some exemplary embodiments of the present inventive concept, the width 222W of the second opening 222H may be substantially equal to the width 212W of the first opening 212H. In an exemplary embodiment of the present inventive concept, the width 222W of the second opening 222H may be less than the width 212W of the first opening 212H.

The upper surface of the buffer pad 220 may be further protected from a fluorine (F) gas generated in a process of etching the second pre-protection layer 222P when the exposed central portion of the buffer pad 220 is minimized.

Figure 8:
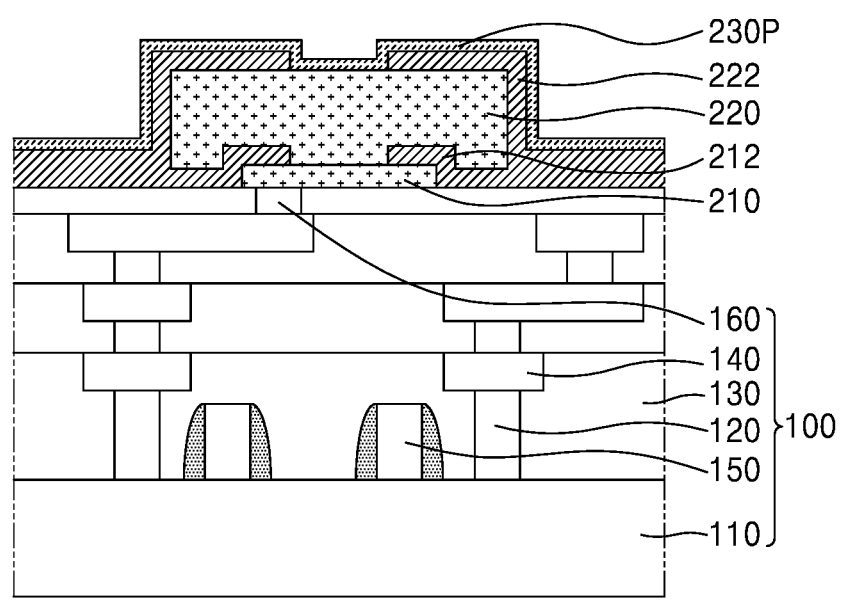
Figure 8:
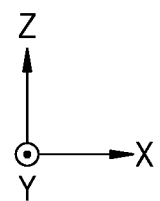

Referring to FIG. 8, after removing the second mask pattern M2 (see FIG. 7), a pre-seed layer 230P is formed above the buffer pad 220 and the second protection layer 222.

A strip process and/or an aching process may be performed to remove the second mask pattern M2 (see FIG. 7).

The pre-seed layer 230P may be formed on the upper surface of the buffer pad 220 and an entire surface of the second protection layer 222 and may have a thickness ranging from about 100 Å to about 0.5 μm in the third direction Z by performing a chemical vapor deposition process or a physical vapor deposition process. The pre-seed layer 230P may include a metal or alloy of Copper (Cu), nickel (Ni), titanium (Ti), tungsten (W), and tin (Sn), or an alloy thereof and may have a single layer structure or a multi-layer structure.

The pre-seed layer 230P functions as a seed for forming the bump structure BS (see FIG. 2). For example, when the bump structure BS is formed by an electroplating method, the pre-seed layer 230P may provide a path in which a current may flow such that the bump structure BS may be formed above the pre-seed layer 230P. According to an exemplary embodiment of the present inventive concept, the bump structure BS may be formed by an electroless plating method.

The pre-seed layer 230P may entirely cover the second opening 222H (see FIG. 6) of the second protection layer 222 conformally.

The central portion of the buffer pad 220 exposed by the second protection layer 222 corresponds to a portion directly contacting the pre-seed layer 230P.

Figure 9:
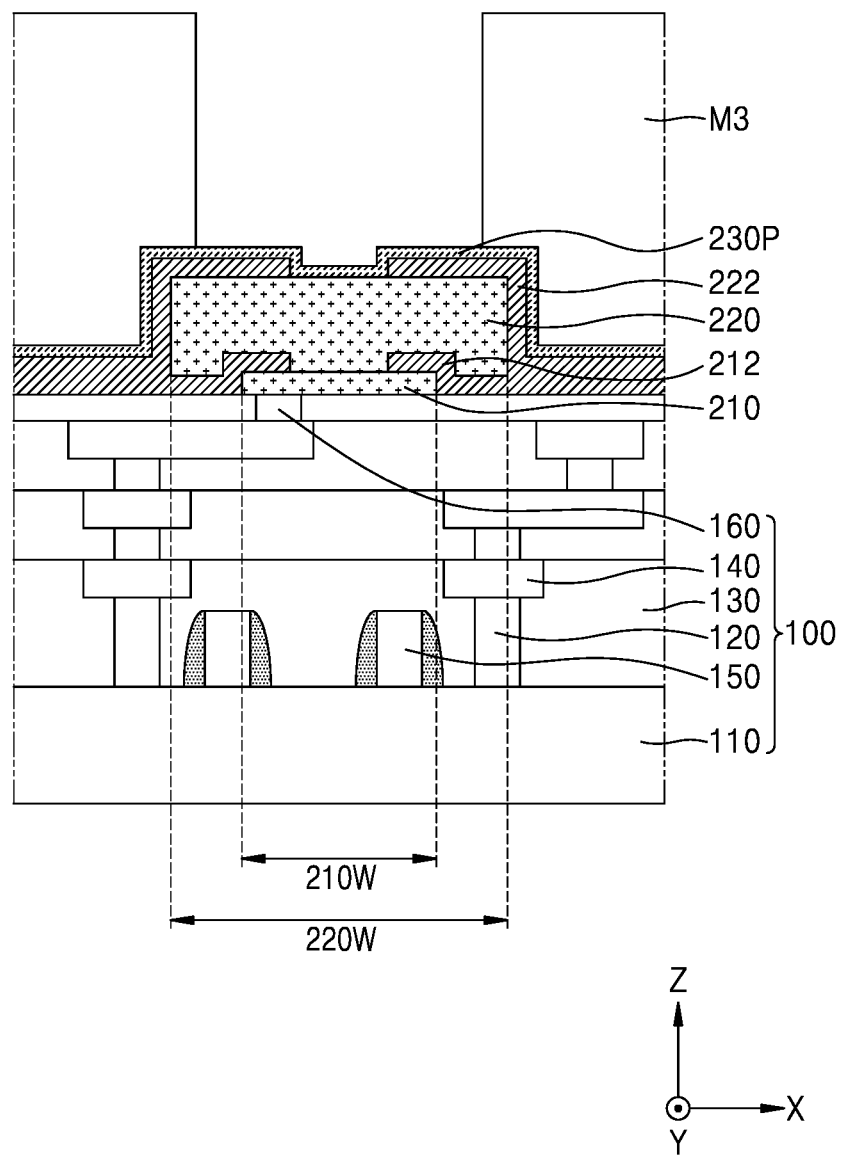

Referring to FIG. 9, a third mask pattern M3 is formed above the pre-seed layer 230P. The third mask pattern M3 may be formed in a pattern exposing a portion of the pre-seed layer 230P.

The exposed portion of the pre-seed layer 230P may include a portion contacting the buffer pad 220. Since the portion exposed by the third mask pattern M3 corresponds to a portion forming the pillar layer 240 (see FIG. 10) and a pre-solder layer 250P (see FIG. 10) in a subsequent process, the exposed portion may be formed in plurality to respectively correspond to the plurality of buffer pads 220. The portion exposed by the third mask pattern M3 may be referred to as a ball land.

Figure 10:
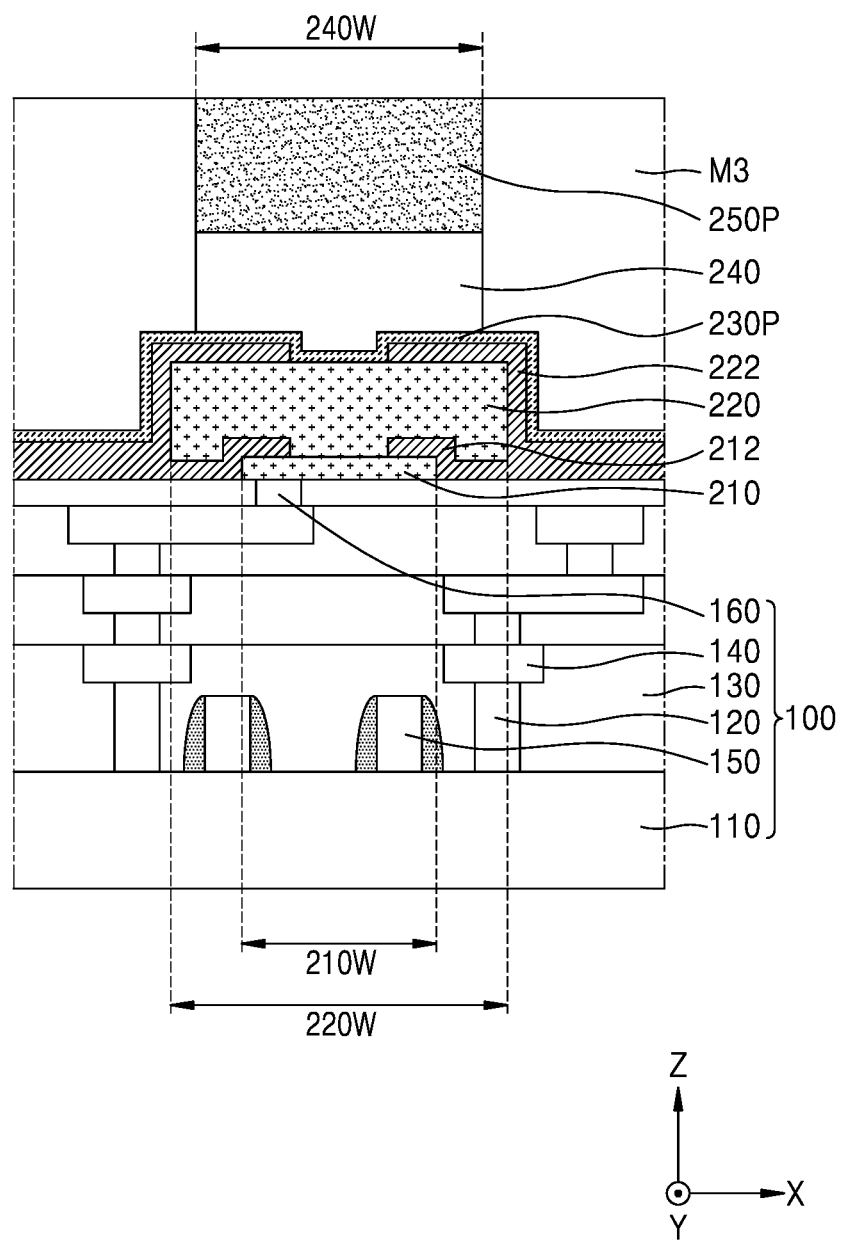

Referring to FIG. 10, a double layer of the pillar layer 240 and the pre-solder layer 250P may be formed above the pre-seed layer 230P on which the third mask pattern M3 is formed. However, the inventive concept is not limited thereto and a single pre-solder layer 250P may alternatively be formed.

The pillar layer 240 may be formed to directly contact an upper surface of the pre-seed layer 230P exposed by the third mask pattern M3. The pillar layer 240 may be formed by electroplating. The electroplating for forming the pillar layer 240 may be referred to as a primary electroplating.

To form the pillar layer 240, the semiconductor substrate 110 on which the third mask pattern M3 is formed may be placed in a bath to perform the primary electroplating. The pillar layer 240 may include, for example, Copper (Cu), nickel (Ni), or gold (Au) or an alloy thereof, or may be a double-layer structure including Copper (Cu), nickel (Ni), and gold (Au).

The pillar layer 240 may be formed to fill only a region exposed by the third mask pattern M3, but not completely fill the region exposed by the third mask pattern M3. For example, a thickness of the pillar layer 240 in the third direction Z may be less than a thickness of the third mask pattern M3 in the third direction Z.

The pre-solder layer 250P may be formed above the pillar layer 240. An upper surface of the pre-solder layer 250P may be substantially level with the upper surface of the third mask pattern M3, or the upper surface of the pre-solder layer 250P may protrude beyond the upper surface of the third mask pattern M3. The pre-solder layer 250P may be formed by electroplating. The electroplating for forming the pre-solder layer 250P may be referred to as secondary electroplating to distinguish it from the primary electroplating for forming the pillar layer 240.

To form the pre-solder layer 250P, the semiconductor substrate 110 on which the pillar layer 240 is formed may be placed in a bath different from the bath used in the first electroplating, and the secondary electroplating may be performed. The pre-solder layer 250P may include an alloy of tin (Sn) and silver (Ag), and a small amount of copper (Cu), palladium (Pd), bismuth (Bi), and or antimony (Sb) may be added.

The width 240W of the pillar layer 240 in the first direction X may be greater than the width 210W the electrode pad 210 in the first direction X and may be less than the width 220W of the buffer pad 220 in the first direction X. In addition, as described above, the width 220W of the buffer pad 220 may be greater than the width 210W of the electrode pad 210. For example, respective widths may be designed such that stress transmitted through the pillar layer 240 may be most effectively relieved by the buffer pad 220.

Figure 11:
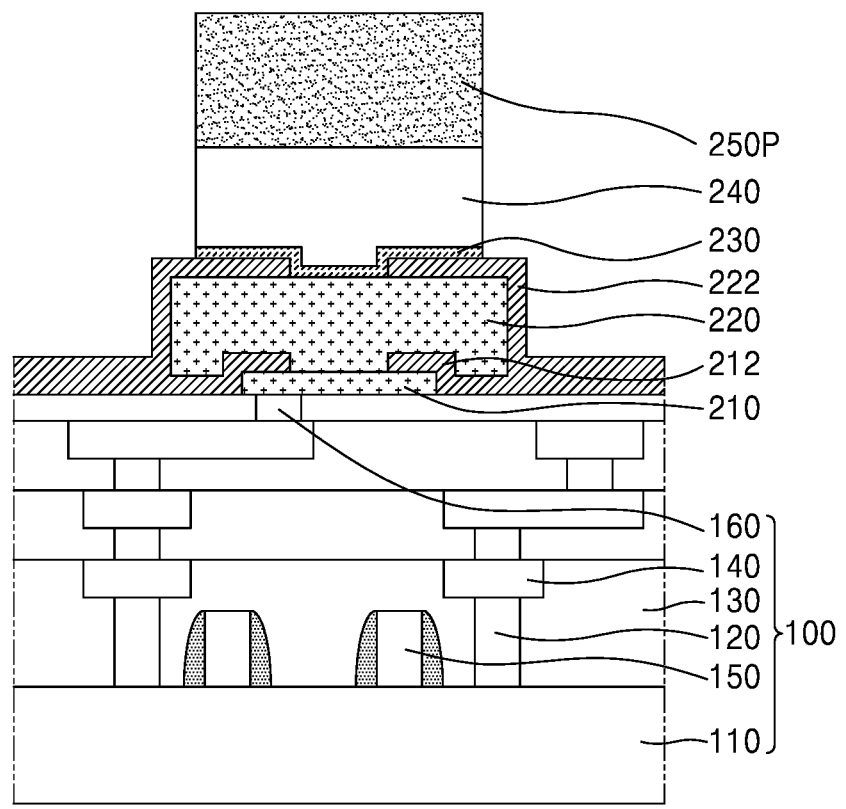

Referring to FIG. 11, after removing the third mask pattern M3 (see FIG. 10), a portion of the pre-seed layer 230P (see FIG. 10) is removed to form the seed layer 230.

A strip process and/or asp ashing process may be performed to remove the third mask pattern M3 (see FIG. 10).

After removing the third mask pattern M3 (see FIG. 10), an externally exposed pre-seed layer 230P (see FIG. 10) may be wet-etched by using the pillar layer 240 and the pre-solder layer 250P as an etching mask. When the pre-seed layer 230P (see FIG. 10) is etched by using a wet etching, which is an isotropic etching, an undercut may be formed in a lower portion of the pillar layer 240.

When a configuration material of the pre-seed layer 230P (see FIG. 10) is Copper (Cu), the externally exposed pre-seed layer 230P may be removed by using an ammoniacal etching. For example, alkaline etchants including $Cu(NH_3)_4Cl_2$, $Cu(NH_3)_2Cl$, $NH_3$, and $NH_4Cl$ may be used. Hereinafter, chemicals including CuO obtained as a result of the etching may be cleaned by using $NH_3$ and $H_2O$.

Referring again to FIG. 2, a reflow process may be performed on the pre-solder layer 250P to form the semiconductor chip 10, according to an exemplary embodiment of the present inventive concept.

The semiconductor substrate 110 is subjected to a heat treatment to perform the reflow process. The reflow process may be performed at a temperature ranging from about 220° C. to about 260° C. The solder layer 250 may be formed by melting the pre-solder layer 250P by the reflow process. The pre-solder layer 250P might not collapse after being melted and the solder layer 250 may be formed above the pillar layer 240 by surface tension, and an intermetallic compound may be formed on an interface between the solder layer 250 and the pillar layer 240. A length from a center to a side of the solder layer 250 in the first direction X may be greater than a length from a center to a side of the pillar layer 240 in the first direction X.

The bump structure BS may include the seed layer 230, the pillar layer 240, and the solder layer 250. The bump structure BS is not limited thereto and might only include the seed layer 230 and the solder layer 250.

A type of the bump structure BS may vary depending on a semiconductor package to be fabricated. The bump structure BS may function as a contact terminal and may be a contact electrically connected to the package substrate 300 (see FIG. 1). A plurality of bump structures BS may exist in the semiconductor chip 10, but only one bump structure BS is shown for convenience of explanation.

Figure 12:
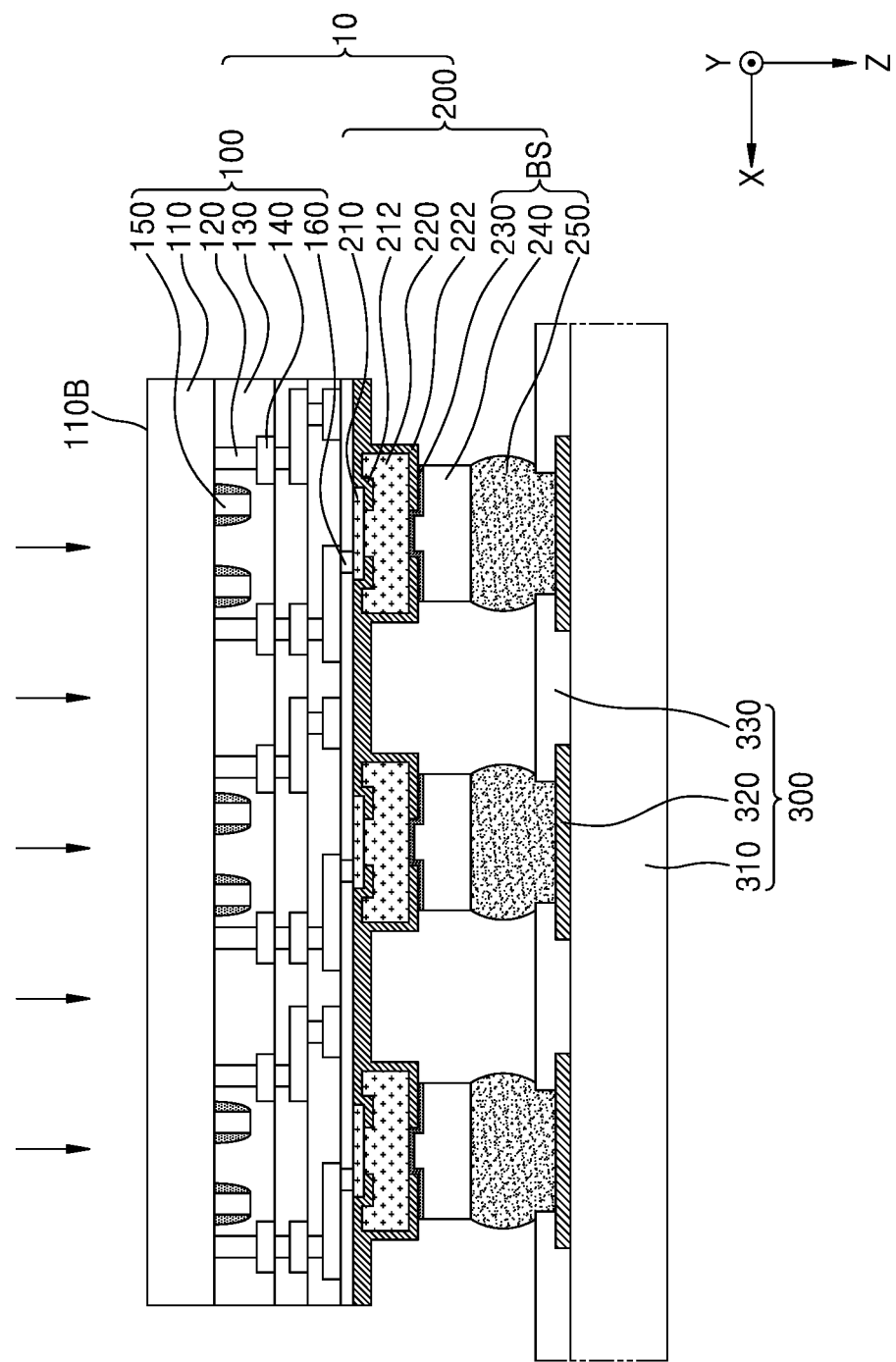
FIG. 12 is a cross-sectional view illustrating a method of fabricating a semiconductor package, according to an exemplary embodiment of the present inventive concept.

FIG. 12 is a cross-sectional view illustrating a method of fabricating the semiconductor package 1 including the semiconductor chip 10, according to an embodiment of the inventive concept.

Referring to FIG. 12, first, the semiconductor chip 10 may be formed by performing processes described with reference to FIGS. 3 through 11. The semiconductor chip 10 may include a plurality of connection structures 200.

Flux may be formed above the bump structure BS and/or the inner connection pad 320. The flux may be formed to a small thickness on a surface of the solder layer 250 to prevent oxidation or unwanted reaction of the solder layer 250. In some exemplary embodiments of the present inventive concept, the flux may be formed by coating with a chloride, a fluoride, a resin, or the like.

Hereinafter, the package substrate 300 may be provided on which the inner connection pad 320 above a surface of the base 310 and the insulating layer 330 exposing a portion of the inner connection pad 320 are formed.

The semiconductor chip 10 may be mounted above the package substrate 300 in a flip chip bonding manner. A lower surface 110B of the semiconductor substrate 110 may be arranged to face the package substrate 300 such that the solder layer 250 may contact the inner connection pad 320. In some exemplary embodiments of the present inventive concept, a process of the solder layer 250 to adhere to the inner connection pad 320 may be performed at a temperature high enough to allow a portion of the solder layer 250 to be melted.

As described above, in a process of mounting the semiconductor chip 10 above the package substrate 300, stress applied to the bump structure BS may be transmitted to a lower portion of the bump structure BS. As described above, the stress may be relieved by the buffer pad 220.

Referring again to FIG. 1, the underfill 410 may at least partially surround a side wall of the connection structure 200 between the semiconductor chip 10 and the package substrate 300. Hereinafter, the molding member 420 at least partially surrounding an upper surface and a side surface of the semiconductor chip 10 may be formed.

Later, the outer connection pad 340 above a surface of the package substrate 300 and the external terminal 350 mounted to the outer connection pad 340 are formed. However, a process of forming the outer connection pad 340 and/or the external terminal 350 may be performed before a process of attaching the semiconductor chip 10.

Figure 13:
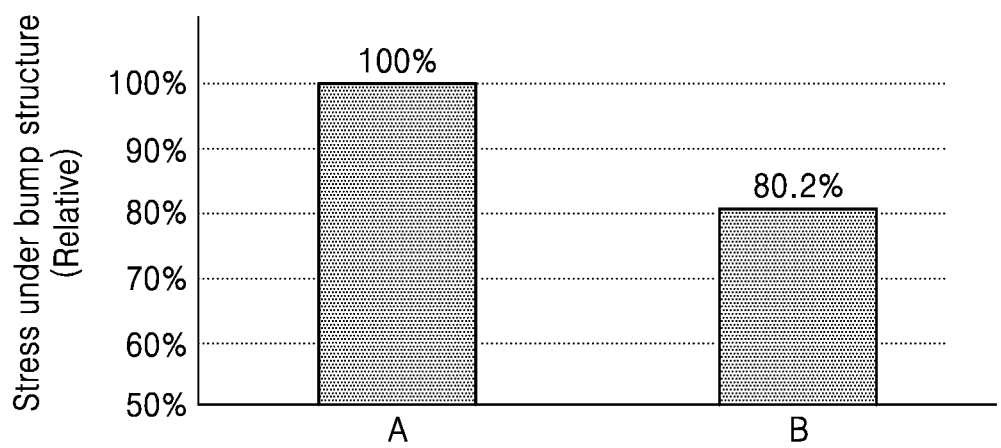
FIG. 13 is a graph showing a thickness of a buffer pad and stress under a bump structure in the semiconductor package, according to an exemplary embodiment of the present inventive concept.

FIG. 13 is a graph showing a thickness of a buffer pad and stress under a bump structure in the semiconductor package, according to an exemplary embodiment of the present inventive concept.

Referring to FIG. 13, in a semiconductor chip A (e.g. a control group), in which a buffer pad is not formed above an electrode pad, and a semiconductor chip B (e.g. an experimental group), in which a buffer pad is formed above an electrode pad and has a thickness of about 5 times a thickness of the electrode pad, stress applied to an interlayer dielectric (a peripheral portion of the upper via 160 in FIG. 12) is measured.

At this time, the stress applied to the semiconductor chip A is normalized to 100% and expressed as a relative value of the stress applied to the semiconductor B.

As a result of the measurement, stress applied to an interlayer dielectric adjacent to the electrode pad in the semiconductor B is measured at a level corresponding to 80.2% of stress applied to an interlayer dielectric adjacent to the electrode pad in the semiconductor A.

Since a level of stress relief of the semiconductor chip B, in which the buffer pad is formed above the electrode pad in a thickness of about 5 times the thickness of the electrode pad is sufficiently significant, an effect of stress relief of the semiconductor B and a semiconductor package including the semiconductor chip B may be expected.

For example, the electrical characteristics and reliability of the semiconductor chip 10 and the semiconductor package 1, according to an exemplary embodiment of the inventive concept, may be increased.

Figure 14:
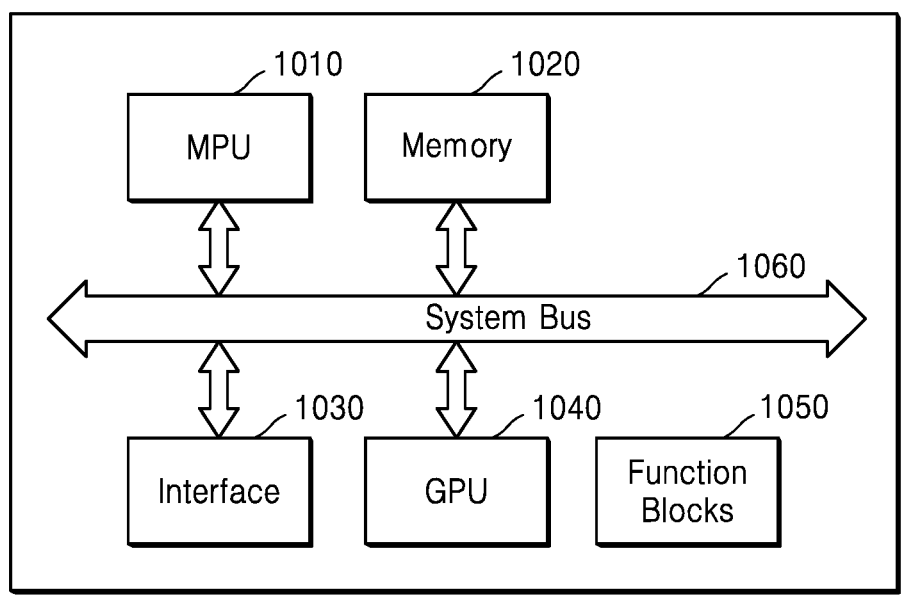
FIG. 14 is a block diagram of a structure of a semiconductor package according an exemplary embodiment of the present inventive concept.

FIG. 14 is a block diagram of a structure of a semiconductor package 1000 according to an exemplary embodiment of the present inventive concept.

Referring to FIG. 14, the semiconductor package 1000 may include a microprocessor 1010, a memory device 1020, an interface 1030, a graphics processing unit 1040, functional blocks 1050, and a system bus 1060 connecting the microprocessor 1010, the memory device 1020, the interface 1030, the graphics processing unit 1040, and the functional blocks 1050 to each other The semiconductor package 1000 may include both the microprocessor 1010 and the graphics processing unit 1040, or may include only one of them.

The microprocessor 1010 may include at least one core and an L2 cache. For example, the microprocessor 1010 may include multiple cores. Each core thereof may have a same or different performance. In addition, each core thereof may be activated at a same time or may be separately activated.

The memory device 1020 may store results processed in the functional blocks 1050 according to a control of the microprocessor 1010. The interface 1030 may exchange information and signals with an external device. The interface 1030 may perform graphics functions. For example, the graphics processing unit 1040 may handle a video codec, or a 3D graphics. The functional blocks 1050 may perform various functions. For example, when the semiconductor package 1000 is an Application Processor used in a mobile device, some of the functional blocks 1050 may perform a communication function. The semiconductor package 1000 may include the semiconductor package 1 described above, according to exemplary embodiments of the present inventive concept.

While the present inventive concept has been particularly shown and described with reference to embodiments thereof, it will be understood that various changes in form and details may be made therein without departing from the spirit and scope of the disclosure.

What is claimed is:

1. A semiconductor chip, comprising:
   a substrate comprising a low-k material layer;
   an electrode pad disposed on the substrate;
   a first protection layer at least partially surrounding the electrode pad, the first protection layer comprising a first opening at an upper portion thereof, wherein the first protection layer is in direct contact with both side surfaces of the electrode pad;
   a buffer pad having a singular structure with a top surface and a bottom surface, the buffer pad being electrically connected to the electrode pad, the buffer pad having a side surface that is planar from the top surface to the bottom surface;
   a second protection layer at least partially surrounding the buffer pad, the second protection layer comprising a second opening at an upper portion thereof, wherein the second protection layer is in direct contact with the top surface of the buffer pad; and
   a pillar layer and a solder layer sequentially stacked on the buffer pad,
   wherein a thickness of the buffer pad is greater than a thickness of the electrode pad, and
   wherein a width of the first opening in a first direction parallel to an upper surface of the semiconductor substrate is equal to or greater than a width of the second opening in the first direction.

2. The semiconductor chip of claim 1, wherein a width of the electrode pad in the first direction is less than a width of the buffer pad in the first direction.

3. The semiconductor chip of claim 1, wherein a width of the pillar layer in the first direction is less than a width of the buffer pad in the first direction.

4. The semiconductor chip of claim 1, wherein a width of the electrode pad in the first direction is less than a width of the pillar layer in the first direction.

5. The semiconductor chip of claim 1, wherein the electrode pad and the buffer pad comprise a same material.

6. The semiconductor chip of claim 1, further comprising: an interlayer dielectric disposed below the electrode pad, the interlayer dielectric comprising a unit element, a wiring layer, and the low-k material layer.

7. The semiconductor chip of claim 1, wherein a center of the electrode pad, a center of the buffer pad, a center of the pillar layer, and a center of the solder layer are aligned in a direction perpendicular to the upper surface of the semiconductor substrate.

8. The semiconductor chip of claim 1, wherein the thickness of the buffer pad is at least 5 times the thickness of the electrode pad.

9. The semiconductor chip of claim 1, wherein the buffer pad is formed above the first protection layer and at least partially fills the first opening and at least partially surrounds the electrode pad with the first protection layer arranged therebetween.

10. The semiconductor chip of claim 1, further comprising: a seed layer disposed below the pillar layer, wherein the seed layer is formed above the second protection layer and at least partially fills the second opening, and wherein an undercut is formed on a side surface of the seed layer.

11. A semiconductor chip, comprising:
    a semiconductor substrate comprising an interlayer dielectric comprising a low-k material and an electrode pad arranged on the interlayer dielectric;
    a protections layer at least partially covering both side surfaces and an upper surface of the electrode pad, the protection layer comprising an inner space having a first opening at a lower portion of the inner space and a second opening at an upper portion of the inner space;
    a buffer pad having a singular structure disposed in the inner space of the protection layer so as to be in direct contact with the protection layer at two side surfaces, an upper surface, and a lower surface of the buffer pad, the buffer pad being electrically connected to the electrode pad via the first opening, and wherein a side surface of the buffer pad is planar from the upper surface to the lower surface thereof; and
    a bump structure which is not in the inner space of the protection layer, is formed above the protection layer, and is electrically connected to the buffer pad via the second opening,
    wherein a width of the first opening in a first direction parallel to an upper surface of the semiconductor substrate is equal to or greater than a width of the second opening in the first direction.

12. The semiconductor chip of claim 11, wherein the protection layer comprises an insulating material, and the electrode pad and the buffer pad, comprise a same conductive material.

13. The semiconductor chip of claim 11, wherein a side surface of the protection layer and a side surface of the buffer pad protrude from a side surface of the bump structure.

14. The semiconductor chip of claim 11, wherein the semiconductor substrate further comprises a conductive via surrounded by the interlayer dielectric, wherein an upper surface of the conductive via is in contact with a lower surface of the electrode pad.

15. The semiconductor chip of claim 11 wherein the bump structure comprises a laminated structure of a pillar layer and a solder layer, the electrode pad and the buffer pad comprise a same material, and an elastic coefficient of a material of the pillar layer is greater than an elastic coefficient of a material of the electrode pad and the buffer pad.

16. A semiconductor package, comprising:
    a package substrate comprising a substrate pad, the package substrate comprising a low-k material layer; and
    a semiconductor chip mounted above the package substrate,
    wherein the semiconductor chip comprises:
    an electrode pad disposed on a semiconductor substrate;
    a first protection layer comprising a first opening at an upper portion of the first protection layer and at least partially surrounding the electrode pad, wherein the first protection layer is in direct contact with both side surfaces of the electrode pad;
    a buffer pad having a singular structure with a top surface and a bottom surface, the buffer pad being electrically connected to the electrode pad, the buffer pad having a side surface that is planar from the top surface to the bottom surface;

a second protection layer comprising a second opening at an upper portion of the second protection layer and at least partially surrounding the buffer pad, wherein the second protection layer is in direct contact with the top surface of the buffer pad; and a pillar layer and a solder layer sequentially stacked on the buffer pad, wherein a thickness of the buffer pad is greater than a thickness of the electrode pad, wherein a width of the first opening in the first direction parallel to an upper surface of the semiconductor substrate is equal to or greater than a width of the second opening in the first direction, and wherein the solder layer is electrically connected to the substrate pad.

17. The semiconductor package of claim 16, wherein a width of the electrode pad in the first direction is less than a width of the pillar layer in the first direction, and a width of the pillar layer in the first direction is less than a width of the buffer pad in the first direction.

18. The semiconductor package of claim 16, further comprising: an underfill disposed in a space between the semiconductor chip and the package substrate, wherein the underfill at least partially surrounds the second protection layer, the pillar layer, and the solder layer.

19. The semiconductor package of claim 16, wherein an elastic coefficient of a material of the pillar layer is greater than an elastic coefficient of a material of the buffer pad.

20. The semiconductor package of claim 16, wherein the semiconductor chip comprises a memory chip, wherein the memory chip is a high bandwidth memory device, and the high bandwidth memory device does not comprise a redistribution layer.

* * * * *